US011194949B1

(12) United States Patent
Saxena et al.

(10) Patent No.: US 11,194,949 B1
(45) Date of Patent: Dec. 7, 2021

(54) PREDICTOR-GUIDED CELL SPREADER TO IMPROVE ROUTABILITY FOR DESIGNS AT ADVANCED PROCESS NODES

(71) Applicant: Synopsys, Inc., Mountain View, CA (US)

(72) Inventors: Prashant Saxena, Portland, OR (US); Wei-Ting Chan, La Jolla, CA (US); Pei-Hsin Ho, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 928 days.

(21) Appl. No.: 15/903,024

(22) Filed: Feb. 22, 2018

Related U.S. Application Data

(60) Provisional application No. 62/462,322, filed on Feb. 22, 2017.

(51) Int. Cl.
*G06F 30/394* (2020.01)
*G06N 20/00* (2019.01)

(52) U.S. Cl.
CPC .......... *G06F 30/394* (2020.01); *G06N 20/00* (2019.01)

(58) Field of Classification Search
CPC .............................. G06F 30/394; G06N 20/00
See application file for complete search history.

(56) References Cited

U.S. PATENT DOCUMENTS

| 6,068,662 | A | 5/2000 | Scepanovic et al. |
| 6,075,933 | A | 6/2000 | Pavisic et al. |
| 7,065,729 | B1 | 6/2006 | Chapman |
| 7,200,827 | B1 | 4/2007 | Ku et al. |
| 7,350,171 | B2 | 3/2008 | Zhang et al. |
| 8,010,925 | B2 | 8/2011 | Buehler et al. |
| 8,015,525 | B2 | 9/2011 | Chang et al. |
| 8,086,976 | B2 | 12/2011 | Hemmett et al. |
| 8,381,152 | B2 | 2/2013 | Lai et al. |
| 8,464,194 | B1* | 6/2013 | Agarwal ............. G03F 7/70441 716/112 |
| 8,839,171 | B1 | 9/2014 | Varadarajan et al. |
| 2003/0217338 | A1 | 11/2003 | Holmes et al. |
| 2008/0301612 | A1* | 12/2008 | Buehler ................ G06F 30/392 716/122 |
| 2010/0199253 | A1* | 8/2010 | Cheng ................. G03F 7/70433 716/55 |
| 2013/0031521 | A1* | 1/2013 | Teoh ..................... G06F 30/398 716/111 |

(Continued)

OTHER PUBLICATIONS

K. Zhong and S. Dutt, "Algorithms for Simultaneous Satisfaction of Multiple Constraints and Objective Optimization in a Placement Flow with Application to Congestion Control", Proc. DAC, 2002, pp. 854-859.

(Continued)

*Primary Examiner* — Michael Jung
(74) *Attorney, Agent, or Firm* — Nicholson De Vos Webster & Elliott LLP; Judith Szepesi

(57) ABSTRACT

A routability optimization engine comprising a hotspot prediction engine to predict locations of a plurality of hotspots in a circuit layout based on a machine learning system, a white space calculator to calculate white space around each of the plurality of hotspots, and a cell spreader engine to redistribute white space around each of the plurality of hotspots to improve routability of the circuit layout.

19 Claims, 8 Drawing Sheets

(56) References Cited

U.S. PATENT DOCUMENTS

| | | | | |
|---|---|---|---|---|
| 2013/0086545 | A1* | 4/2013 | Alpert | G06F 30/394 716/129 |
| 2014/0358830 | A1* | 12/2014 | Chiang | G06N 20/00 706/12 |
| 2015/0286768 | A1* | 10/2015 | Macdonald | G06F 30/394 257/773 |
| 2016/0216316 | A1 | 7/2016 | Kim | |

OTHER PUBLICATIONS

P. Spindler and F. M. Johannes, "Fast and Accurate Routing Demand Estimation for Efficient Routability-Driven Placement", Proc. DATE, 2007, pp. 1226-1231.

Q. Zhou, X. Wang, Z. Qi, Z. Chen, Q. Zhou and Y. Cai, "An Accurate Detailed Routing Routability Prediction Model in Placement", Proc. ASQED, 2015, pp. 119-122.

A. B. Kahng and X. Xu, "Accurate Pseudo-Constructive Wirelength and Congestion Estimation", Proc. SLIP, 2003, pp. 61-68.

A. E. Caldwell A. B. Kahng, S. Mantik, I. L. Markov and A. Zelikovsky, "On Wirelength Estimations for Row-based Placement", IEEE Trans. on CAD 18(9) (1999), pp. 1265-1278.

A. E. Caldwell, A. B. Kahng and I. L. Markov, "Hierarchical Whitespace Allocation in Top-down Placement", IEEE Trans. on CAD 22(11) (2003), pp. 1550-1556.

Andrew E. Caldwell, Andrew B. Kahng, and Igor L. Markov, "Hierarchical Whitespace Allocation in Top-down Placement," Cadence Design Systems, River Oaks Parkway, San Jose, CA 95134, UC San Diego CSE and ECE Departments, La Jolla, CA 92093-0114, Univ. of Michigan, EECS Dept., Ann Arbor, MI 48109-2122, p. 1-13.

Chen Li, Ming Xie, Cheng-Kok Koh, Jason Cong, Patrick H. Madden. "Routablility-Driven Placement and White Space Allocation." IEEE Transactions on Computer-Aided Design of Integrated Circuits and Systems, vol. 26, No. 5, May 2007, p. 858-871.

D. Ding, A. J. Tores, F. G. Pikus and D. Z. Pan, "High performance lithographic hotspot detection using hierarchically refined machine learning," 16th Asia and South Pacific Design Automation Conference (ASP-DAC 2011), Yokohama, 2011, pp. 775-780.doi: 10.1109/ASPDAC.2011.57222940.

Duo Ding, Xiang Wu, Joydeep Ghosh, and David Z. Pan. "Machine Learning based Lithographic Hotspot Detections with Critical-Feature Extraction and Classification." p. 1-4. ECE Dept., University of Texas at Austin, Austin, TX 78712.

J. A. Roy and I. L. Markov, "Seeing the Forest and the Trees: Steiner Wirelength Optimization in Placement", IEEE Trans. on CAD, 23(4) (2007), pp. 632-644.

J. Westra, C. Bartels and P. Groeneveld, "Probabilistic Congestion Prediction", Proc. ISPD, 2004, pp. 204-209.

K. Nirmala Devi and V. Murali Bhaskarn, "Online Forums Hotspot Prediction Based on Sentiment Analysis." Journal of Computer Science 8 (8): 1219-1224, 2012.

K. Tsota, C.-K. Koh and V. Balakrishnan, "Guiding Global Placement with Wire Density", Proc. ICCAD, 2008, pp. 212-217.

M. Pan and C. Chu, "IPR: An Integrated Placement and Routing Algorithm", Proc. DAC, 2007, pp. 59-62.

M. Wang, X. Yang, K. Eguro and M. Sarrafzadeh, "Multicenter Congestion Estimation and Minimization during Placement", Proc. ISPD, 2000, pp. 147-152.

M.-C. Kim, J. Hu, D.-J. Lee and I. L. Markov, "A SimPLR Method for Routability-Driven Placement", Proc. ICCAD, 2011, pp. 67-73.

M.-K. Hsu, S. Chou, T.-H. Lin and Y.-W. Chang, "Routability-Driven Analytical Placement for Mixed-Size Circuit Designs", Proc. ICCAD, 2011, pp. 80-84.

S. N. Adya, I. L. Markov and Paul G. Villarrubia, "On Whitespace and Stability in Mixed-Size Placement and Physical Synthesis", Integration, the VLSI Journal 39(4) (2008), pp. 340-362.

T. Hastie, R. Tibshirani and J. Friedman, The Elements of Statistical Learning: Data Mining, Inference, and Prediction, Springer, 2009.

T. Sadakane H. Shirota, K. Takahashi, M. Terai and K. Okazaki, "A Congestion-Driven Placement Improvement Algorithm for Large Scale Sea-of-gates Arrays", Proc. CICC, 1997, pp. 573-576.

T. Taghavi, C. J. Alpert, A. Huber, Z. Li, G.-J. Nam and S. Ramji, "New Placement Prediction andMitigation Techniques for Local Routing Congestion", Proc. ICCAD, 2010, pp. 621-624.

J. Brenner and A. Rohe, "An Effective Congestion Driven Placement Framework", Proc. ISPD, 2002, pp. 6-11.

W. Hou, H. Yu, X. Hong, Y. CAli, W. Wu, J. Gu and W. H. Kao, "A New Congestion-Driven Placement AlgorithmBased on Cell Inflation", Proc. ASP-DAC, 2001, pp. 606-608.

W.-H. Liu Y.-L. Li and C.-K. Koh, "A Fast Maze-Free Routing Congestion Estimator with Hybrid Unilateral Monotonic Routing", Proc. ICCAD, 2012, pp. 713-719.

W.-H. Liu, T.-K. Chien and T.-C. Wang, "A Study on Unroutable Placement Recognition", Proc. ISPD, 2014, pp. 19-26.

W.-H. Liu, T.-K. Chien and T.-C. Wang, "Region-Based and Panel-Based Algorithms for Unroutable Placement Recognition", Proc. IEEE Trans, on CAD 34(4) (2015), pp. 502-514.

W.-T. J. Chan, Y. Du, A. B. Kahng, S. Nath and K.Samadi, "BEOL Stack-Aware Routability Prediction from Placement Using Data Mining Technique", Proc. ICCD, 2016, to appear.

X. He, T. Huang, L. Xiao, H. Tian, G. Cui and E. F.Young, "Ripple: An Effective Routability-Driven Placer by Iterative Cell Movement", Proc. ICCAD, 2011, pp. 74-79.

X. He, T. Huang, W.-K. Chow, J. Kuang, K.-C. Lam, W. Cail and E. F. Y. Young, "Ripple 2.0: High Quality Routability-Driven Placement via Global Router Integration", Proc. DAC, 2013, pp. 1-6.

Xiaojian Yang, Bo-Kyung Choi, and M. Sarrafzadeh. "Routability-Driven White Space Allocation for Fixed-Die Standard-Cell Placement." in IEEE Transactions on Computer-Aided Design of Integrated Circuits and Systems, vol. 22, No. 4, pp. 410-419, Apr. 2003.doi: 10.1 109/TCAD.2003.809660.

Z. Qi, Y. Cai and Q. Zhou, "Accurate Prediction of Detailed Routing Congestion using Supervised Data Learning", Proc. ICCD, 2014, pp. 97-103.

Z.-W. Jiang B.-Y. Su and Y.-W. Chang, "Routability-Driven Analytical Placement by Net Overlapping Removal for Large-scale Mixed-Size Designs", Proc. DAC, 2008, pp. 167-172.

\* cited by examiner

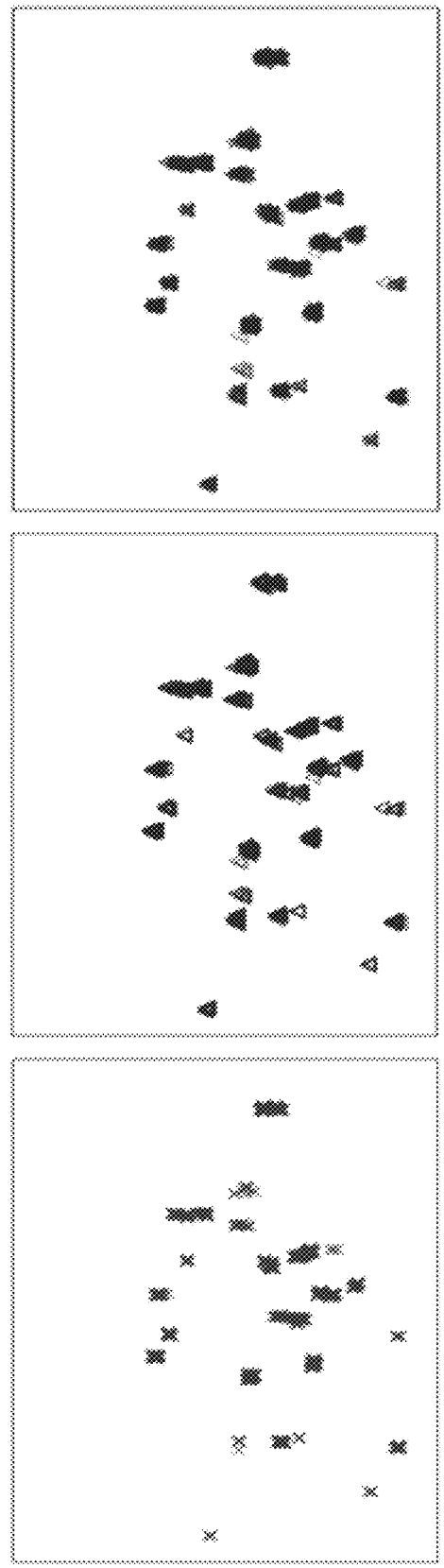

|  | Actual | |
|---|---|---|
| Routability Optimization Engine Predicted | False | True |
| False | 98571 | 117 |
| True | 170 | 344 |

Figure 4A

|  | Actual | |
|---|---|---|
| Prior Art Predictor Predicted | False | True |
| False | 98260 | 350 |
| True | 481 | 111 |

Figure 4B

PREDICTOR-GUIDED CELL SPREADER TO IMPROVE ROUTABILITY FOR DESIGNS AT ADVANCED PROCESS NODES

RELATED APPLICATION

The present application claims priority to U.S. Provisional Application No. 62/462,322, filed on Feb. 22, 2017, and incorporates that application in its entirety.

FIELD

The present invention relates to routability, and more particularly to routability optimization at advanced process nodes.

BACKGROUND

Route completion is a major concern for designs at advanced process nodes, and in particular at 10 nm and beyond. The occurrence of design rule check (DRC) violations after detailed routing can prevent a design from being taped out.

To solve this problem, state-of-the-art commercial electronic design automation (EDA) tools global-route the design to produce a global-route congestion map that is then used by the placer to optimize the placement of the design to reduce detailed-route DRC violations. However, at advanced process nodes, DRC violations arising from multiple patterning and pin-access constraints drastically weaken the correlation between global-route congestion and detailed route DRC violations.

As a result, routability optimization by the placer based on the global-route congestion map often leaves far too many detailed route DRC violations to be manually fixable by designers, thus putting the design tapeout at risk.

At advanced process nodes, global route (GR) based congestion maps do not correlate well with DRC violation maps obtained at the end of detailed routing. This is because of the numerous complicated design rules imposed upon the design layouts for viable fabrication; these DRCs, most of which are not visible in the GR routing model, constrain the detail router significantly. As a result, GR-based congestion maps are no longer good predictors either for evaluating overall design routability or for identifying potential DRC violation hotspots prior to detailed routing. Therefore, they can easily mislead any routability optimization engines that rely on these maps, resulting in poor effectiveness at resolving routability problems, even as they trade-off timing and area while ameliorating spurious congestion problems.

FIGS. 1A-1C show an example of such a miscorrelation on 7 nm design. The figures compare a map of the actual DRC violations with the congestion hotspots identified by a GR-based congestion map obtained by running a state-of-the art industrial global router on the same layout, as well as an overlay of these two maps. The GR-based congestion map is thresholded so as to ensure that both maps display the same number of violating global routing grid cells (also called gcells)).

FIG. 1A shows the overflows extracted from a GR-based congestion map. FIG. 1B shows the DRC violations after detailed routing. FIG. 1C overlays the GR-predicted overflows and actual DRCs. It shows numerous false positive and false negative predictions. This type of miscorrelation between the congestion map and the actual DRC hotspot map demonstrates why the routability improvement techniques traditionally employed during physical synthesis are not very effective at advanced process nodes (since they are driven by GR-based congestion maps).

BRIEF DESCRIPTION OF THE FIGURES

The present invention is illustrated by way of example, and not by way of limitation, in the figures of the accompanying drawings and in which like reference numerals refer to similar elements and in which:

FIGS. 3A-3C show the accuracy of the predicted DRC hotspots utilizing the routability optimization engine.

FIGS. 4A and 4B show exemplary test results, of a prior-art implementation and the routability optimization engine.

DETAILED DESCRIPTION

Figures 1A, 1B, 1C:
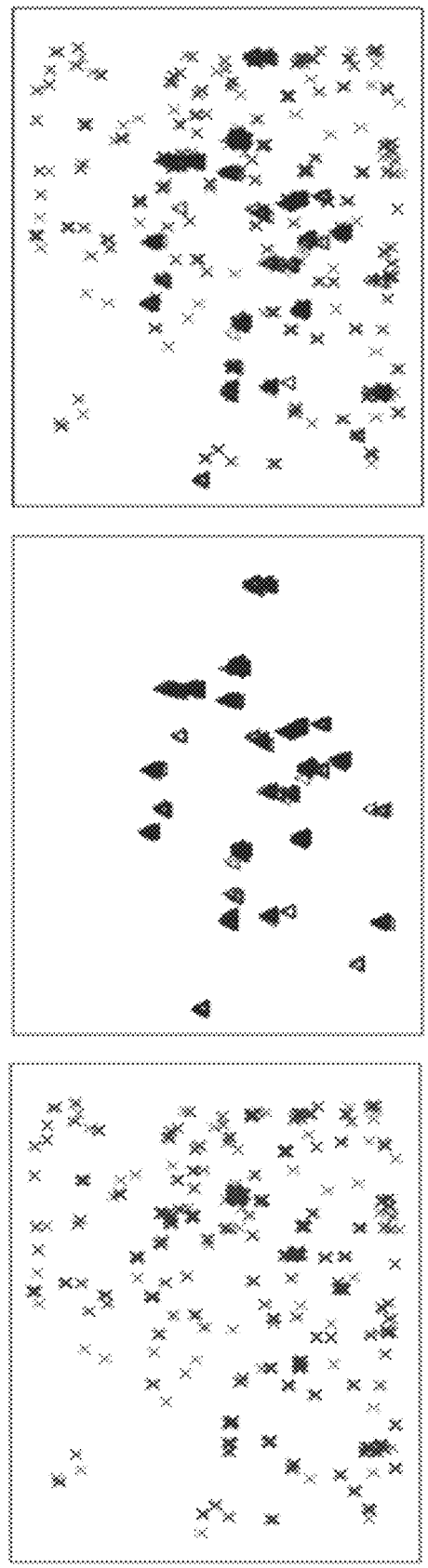
FIGS. 1A-1C show an example of a miscorrelation between actual DRC violations and predictions, utilizing the prior art methods.

A method is described that employs (1) machine learning techniques to predict the locations of detailed-route DRC violations after global routing and (2) detailed placement techniques that use this prediction to effectively reduce detailed-route DRC violations without any significant timing or area penalty. The effectiveness of this approach has been demonstrated on a hard-to-route 7 nm design on which this system reduced the number of detailed-route DRC violations by 5× without hurting timing or area.

The present method automates a system which would be impossible to perform with pencil and paper. It provides a specific improvement in DRC violation identification, and focuses on a specific method that improves a relevant technology of integrated circuit design. It incorporates the specific rules that improve the existing technological process by allowing the automation of further tasks. Furthermore, the integrated circuit which is routed using the described process may be manufactured.

Firstly, a sophisticated machine-learning based predictor is used to generate a statistically robust model that takes in various input parameters describing the design layout, the netlist and its global routing over various localized windows, and predicts whether any particular global routing cell is likely to be a routability hotspot.

Next, this predictor is used to drive a new cell spreader engine to carefully redistribute any white space already present in the vicinity of each predicted routability hotspot, during a postprocessing phase at the end of the preroute flow.

One key advantage of this approach is that the predictor's accuracy allows focus on the predicted hotspots. This minimizes the chance of large legalization displacements even near the routability hotspots (since the system introduces no new white space), while avoiding any layout modifications in other regions. Therefore, when applied on a timing-converged netlist at the end of the preroute flow, the process obtains significant routability improvements without sacrificing timing, area or wire length. This contrasts with traditional approaches that often trade off routability against these metrics.

More generally, the accuracy of the predictions can be used to improve the effectiveness of traditional routability improvement techniques such as cell expansion during coarse placement.

The process has been tested in the real world. On a recent challenging N7 (7 nm) design on which a state-of the art commercial design implementation tool had been struggling, the predictor was able to predict the locations of 73.4% of the eventual route-DRC violations accurately, with a false positive rate of <0.2%. Using this prediction, the cell spreader engine was able to reduce the number of route-DRC violations in the design at the end of detail routing by a factor of 5× (from 8478 to 1671) without incurring any significant timing penalty or increasing area. Given the time constraints and complexity of such routing, it would be have been impossible to perform this process manually, and the prior art designs could not achieve comparable results.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

As semiconductor technology advances, the EDA and design community is observing increasing unpredictability in the IC implementation flow. In particular, design tapeouts are increasingly placed at risk by the inability of the router to complete the routing successfully. Historically, any risk of unroutability could be identified prior to the runtime-intensive detailed route (DR) stage from congestion maps generated using global routing (GR). However, the miscorrelation between these congestion maps and the actual routing design rule check (DRC) violation maps has increased significantly at current process nodes due to the many new, complicated design rules defined at these nodes. This unpredictability is leading to more and more iterations (and consequent schedule slippage) during design implementation, sometimes even endangering the design tapeout itself In order to overcome the miscorrelation between the GR-based congestion map and the actual DRC map, the process uses machine learning to improve the accuracy of the identification of potential DRC hotspots. The process models this prediction problem as a supervised classification problem, in one embodiment. The DRC-violating gcells in a training set of IC layouts are labeled with true labels, and cleanly-routed gcells a relabeled with false labels in one embodiment. The process extracts various parameters from the training netlists and layouts and uses them to build an accurate predictor. Using this predictor, the system implements an engine that minimally perturbs the converged physical synthesis netlist in a way that surgically redistributes the white space in the vicinity of the predicted DRC hotspots so as to ameliorate those hotspots without hurting timing, area or wire length.

Figure 2:
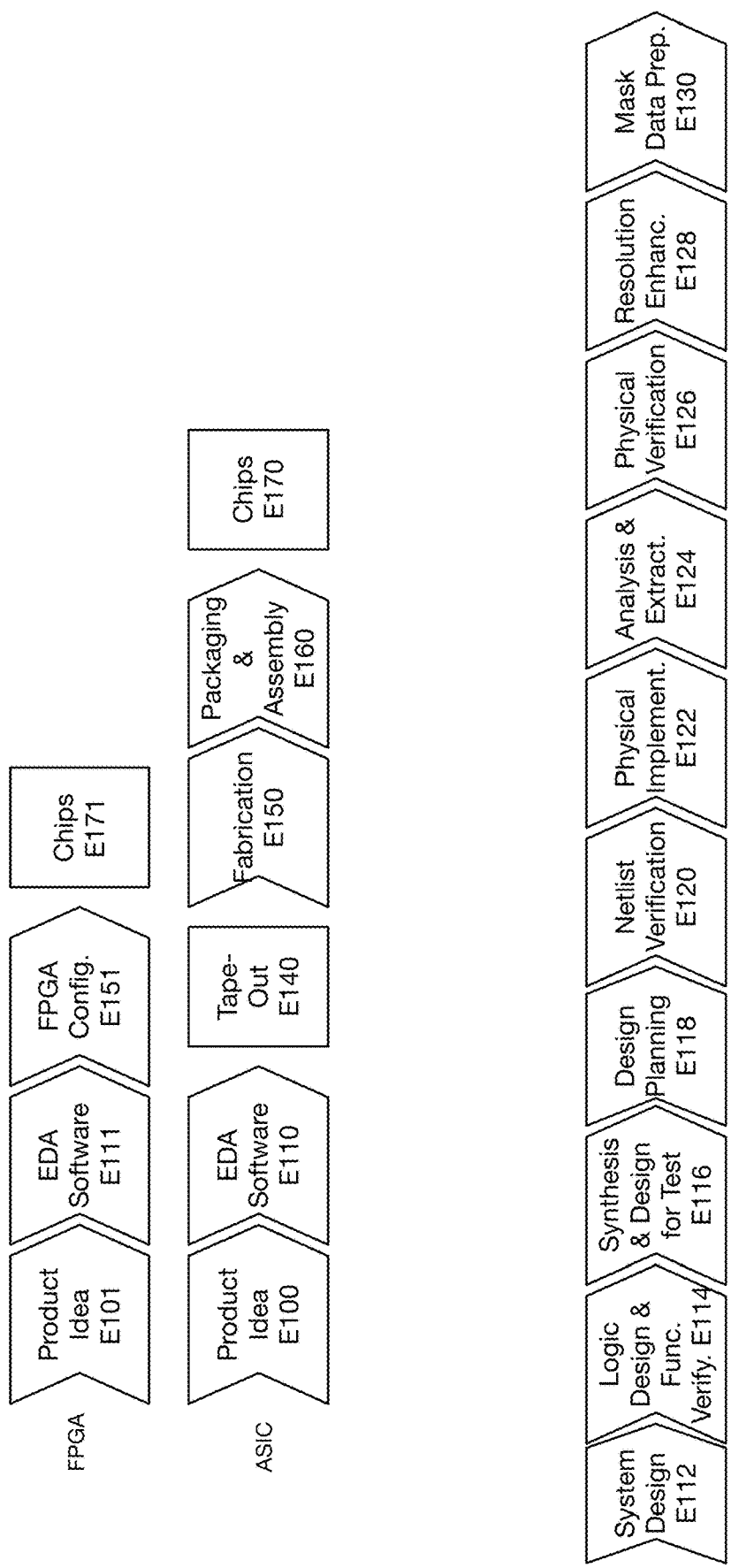
FIG. 2 is an overview diagram of the electronic design automation (EDA) process.

In one embodiment, the routing optimization engine described is part of one or more electronic design automation (EDA) tools and used to design, calibrate, and adjust circuit designs, and circuit blocks. An EDA flow can include multiple steps, and each step can involve using one or more EDA software tools. Some EDA steps and software tools are described below, with respect to FIG. 2. These examples of EDA steps and software tools are for illustrative purposes only and are not intended to limit the embodiments to the forms disclosed.

To illustrate the EDA flow, consider an EDA system that receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (functional element). The models define performance parameters for the cells; e.g., parameters related to the operational behavior of the cells, such as power consumption, delay, transition time, and noise. The netlist and cell library are typically stored in computer readable media within the EDA system and are processed and verified using many well-known techniques.

Before proceeding further with the description, it may be helpful to place these processes in context. At a high level, for an application specific integrated circuit (ASIC), the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170). For a field programmable gate array (FPGA), the process starts with the product idea (step E101) and is realized in an EDA software design process (step E111). When the design is finalized, the FPGAs may be configured (event E151), applying the code to the FPGA circuits, resulting, ultimately, in finished chips (result E171).

The EDA software design process (step E110/E111) is actually composed of a number of steps E112-E130, shown in linear fashion for simplicity. In an actual design process, the particular design might have to go back through steps until certain tests are passed. Similarly, in any actual design process, these steps may occur in different orders and combinations. This description is therefore provided by way of context and general explanation rather than as a specific, or recommended, design flow for a particular circuit design.

A brief description of the components steps of the EDA software design process (step E110) will now be provided:

System design (step E112): The designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step E114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step E116): Here, the VHDL/Verilog is translated into a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Design planning (step E118): Here, an overall floorplan for the chip is constructed and analyzed for timing and top-level routing. Exemplary EDA software products from Synopsys, Inc. that can be used at this step include Jupiter and Floorplan Compiler products.

Netlist verification (step E120): At this step, the netlist is checked for compliance with timing constraints and for correspondence with the VHDL/Verilog source code. Exemplary EDA software products from Synopsys, Inc. that can be used at this step include VCS, VERA, Formality and PrimeTime products.

Physical implementation (step E122): The placement (positioning of circuit elements), circuit optimization (cell sizing, buffer insertion and some logic transforms), and routing (connection of the same) occurs at this step. Exemplary EDA software products from Synopsys, Inc. that can be used at this step include the Astro, ICC, and ICC2 product.

Analysis and extraction (step E124): At this step, the circuit function is verified at a transistor level, this in turn permits what-if refinement. Exemplary EDA software products from Synopsys, Inc. that can be used at this step include Star RC/XT, Raphael, and Aurora products. For FPGA design, in one embodiment the process ends here. Because FPGA programming is done through software, there are no physical configuration, resolution, and mask design issues.

For ASICS, next comes the Physical verification (step E126): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step E128): This step involves geometric manipulations of the layout to improve manufacturability of the design. Exemplary EDA software products from Synopsys, Inc. that can be used at this step include iN-Phase, Proteus, and AFGen products.

Mask data preparation (step E130): This step provides the "tape-out" data for production of masks for lithographic use to produce finished chips. Exemplary EDA software products from Synopsys, Inc. that can be used at this step include the CATS® family of products.

With respect to this application, the routability optimization engine may be implemented in the physical implementation (E122), to ensure that the design can be properly routed, taking into account the DRC hotspots.

In order to analyze the root causes of routability problems, the process first partitions training layouts into small grids on top of gcells (referred to as local windows) to generate training data. The process then extracts numerous netlist and layout parameters for each local window in the training layouts. These parameters may include:

Density parameters such as local pin density and local cell density;

GR parameters such as local overflow, demand and capacity of each metal layer and via layer obtained from a global routing invocation;

Pin proximity measuring the average and minimum spacings between pins in each local window;

"Unfriendly" cells, which are library cells that occur in the DRC hotspots (local windows with more than one DRC) at a rate significantly higher than their overall frequency;

Multi-height and sequential cells and parameters relating to their fan-ins, fan-outs, and occurrence frequencies of these cells in local windows, Connectivity parameters such as the number of buried nets completely enclosed inside the local windows, the number of non-buried nets crossing these window boundaries, and the number of connected pins lying outside the windows;

Structural parameters such as the number and depth of fan-in and fan-out logic stages in paths crossing local windows.

The process then goes through an iterative process of training the predictor model using the parameter list. In each iteration, the statistical significance of the various parameters are measured, and the locations of both false-positive and false-negative predictions are analyzed. This data is used to refine the parameter list and identify additional predictive features of the design.

Besides incorporating different parameters to improve the prediction accuracy, the process may apply one or more of the following approaches to improve the accuracy and robustness of the local hotspot predictor.

Since the majority of the gcells in a typical layout do not have DRC violations, the training of the predictor may be easily misguided by the biased distribution of the few DRC-violating gcells and the many DRC-clean gcells. In one embodiment, this problem is addressed by emphasizing the DRC-violating gcells, increasing their weights during the training stage.

Given that typically there are few real-world advanced node designs available during the early stages of tool development for those nodes (e.g., 7 nm in 2016), it becomes important to choose the training methodology carefully so as to avoid overfilling. In one embodiment this done by randomly choosing a percentage of the gcells from the layout to be the training data set and using the remaining gcells for testing. In one embodiment, the selection is 20/80, with 80% of the gcells used for training.

The process repeats this randomized evaluation some number of times and uses the average and distribution of the prediction accuracy from these runs to draw conclusions about the tested parameter set and mathematical prediction model. In one embodiment, the mathematical prediction model may be linear regression, logistic regression, or Support Vector Machine (SVM).

In order to take the neighborhood effect into consideration, in one embodiment the process uses both small and large local windows. In one embodiment, the process also annotates the central gcells. In one embodiment, the central gcell of each window is annotated with the average and/or extremal (i.e., maximum and minimum) values of selected parameters within the expanded observation windows. The expanded observation windows, in one embodiment, are small and large local windows centered on that gcell.

In one embodiment, the R statistical analysis package is used to construct the predictor. Based on experiments, the SVM (with a radial basis function (RBF) kernel) has been determined to provide better separation between DRC gcells and non-DRC gcells than linear or logistic regression models. FIG. 3A-3C shows a plot of the predicted DRC hotspots (red squares, FIG. 3A) and actual DRC hotspots (blue squares, FIG. 3B). The contrast with FIG. 1, shown above, the accuracy of GR-based predictions is readily apparent from the overlap graphic of FIG. 3C.

FIGS. 4A and 4B shows actual experimental results. The learning-based predictor provides a significantly more accurate prediction of the DRC hotspots. In some experiments, the process achieved 74% true-positive rate while the false-positive rate was less than 0.2%. This is in contrast to a true-positive rate of 24% and a false-positive rate of 0.5% obtained from a typical a typical state-of-the-art GR-based predictor (FIG. 1).

Figure 5:
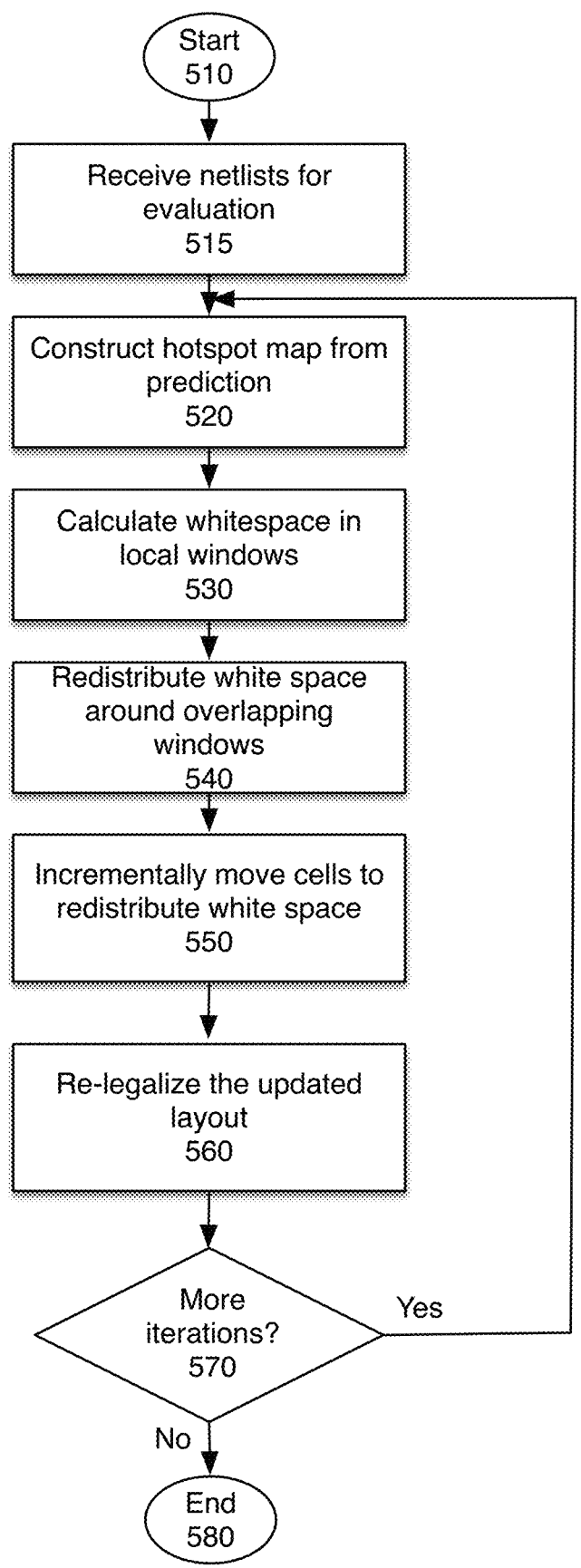
FIG. 5 is a flowchart of one embodiment of utilizing the routing optimization engine.

FIG. 5 is a flowchart of one embodiment of the use of the predictor-guided routability optimization engine. The process starts at block 510.

At block 515, the layout of a timing-converged netlist is received.

At block 520, the DRC prediction model is used to identify the potential DRC hotspots in that layout.

At block 530, the white space is calculated in local windows around hot spots. The system includes a local white space optimization engine that redistributes the white space already present in the neighborhood of the predicted DRC hotspots in a way that improves the routability of these hotspots. Real-world physical implementation flows are almost invariably run under some form of local cell density constraints in order to improve the flow convergence. Such constraints ensure the existence of white space everywhere in the layout when measured at some level of spatial granularity. However, this granularity is typically much larger than that of individual cells. Therefore, a default white space distribution is not always able to resolve detailed routing DRC problems.

This shortcoming is addressed effectively by introducing a new, detailed white space redistribution stage, at block 540, that relies on the hotspot prediction model to minimize the perturbation to the layout while maximizing the routability impact of the redistribution.

In one embodiment, during this redistribution process, the process marks out local windows around each hotspot, calculates the amount of white space available in these windows in order to compute a local white space budget (splitting overlapping windows appropriately during this process), and then incrementally distributes this budget among the cell instances within the windows. In one embodiment, the redistribution is realized by translating the white space budget for each cell instance into a temporary "keepout" blockage adjacent to the cell instance, legalizing this modified layout, and then removing the temporary blockages.

The detailed routing engine subsequent to this white space redistribution step, uses the space newly introduced between problematic cell instances to handle the complicated design rules by incrementally moving cells to redistribute the white space, at block 550. This approach of applying redistribution to only the potential DRC hotspots and avoiding the introduction of any new white space there, while leaving the rest of the layout untouched, minimizes the perturbation to the already converged layout, thus minimizing the likelihood of any significant timing penalty from the application of this algorithm. Indeed, experimental results demonstrate large routability improvements from the application of this algorithm.

At block 560, the design is re-legalized. Because redistribution is only around the predicted DRC hotspots, the perturbation is minimized.

Figure 6:
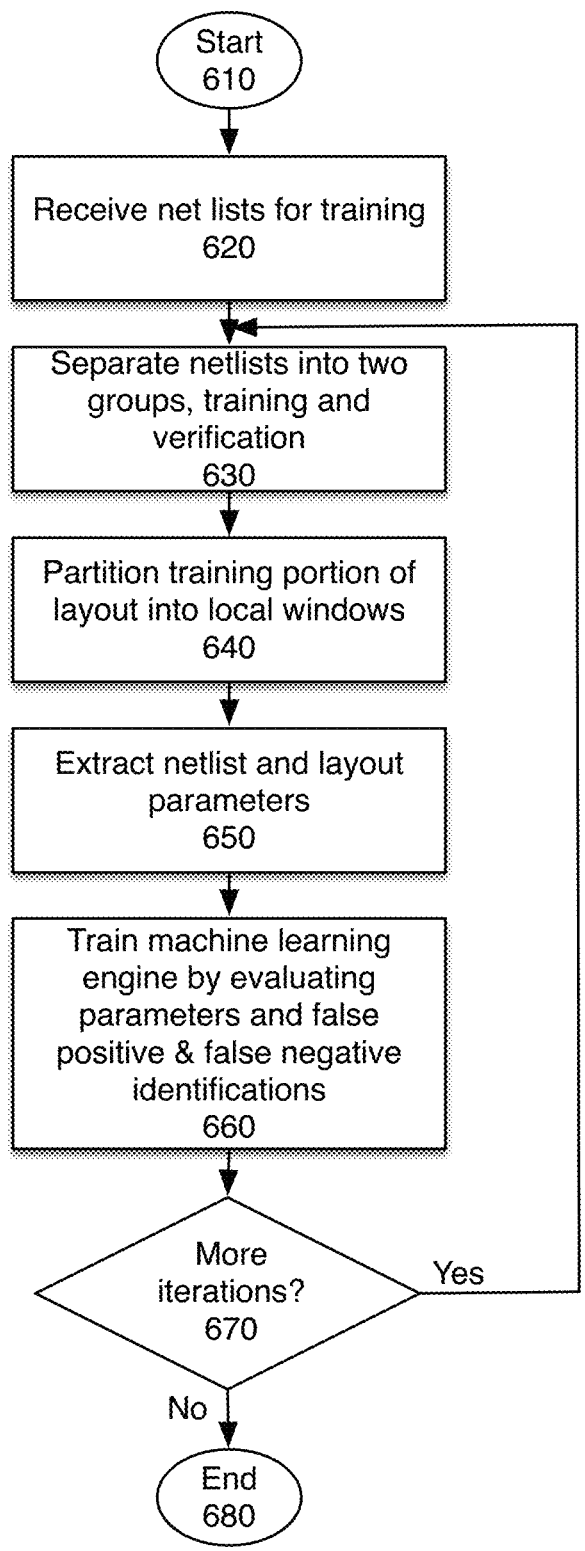
FIG. 6 is a flowchart of one embodiment of training the system.

In one embodiment, this process may be iterated, as determined at block 570, with the newly re-legalized layout being used as the "converted layout" input to the system. If no iteration is needed, FIG. 6 is a flowchart of one embodiment of training the system. The process starts at block 610.

At block 620, the process receives a set of netlists for training. The training netlists are analyzed netlists with each hotspot identified.

At block 630, each of the netlists is separated into two groups, a training group and a verification group. In one embodiment, the separation is 20% for training, 80% for verification. In another embodiment, different designs that have been mapped to the same cell library are used for training and verification respectively.

At block 640, the layout is partitioned into small grids, or local windows.

At block 650, the netlist and layout parameters are extracted.

At block 660, the machine learning techniques are used to train the routing optimization engine, by evaluating the statistical significance of the various parameters, and comparing the locations of the false-positive and false-negative predictions. In one embodiment, the ICC2 engine by Synopsys, Inc. is used for detailed routing, layout analysis, and global routing. In one embodiment, model generation uses SVM in R.

FIG. 670, the process determines whether to iterate the training after analyzing the false positives and false negatives and adjusting the parameter set appropriately if needed. If so, the process returns to block 630. Otherwise, the process ends at block 680, with the hotspot separation portion of the routability optimization engine.

Figure 7:
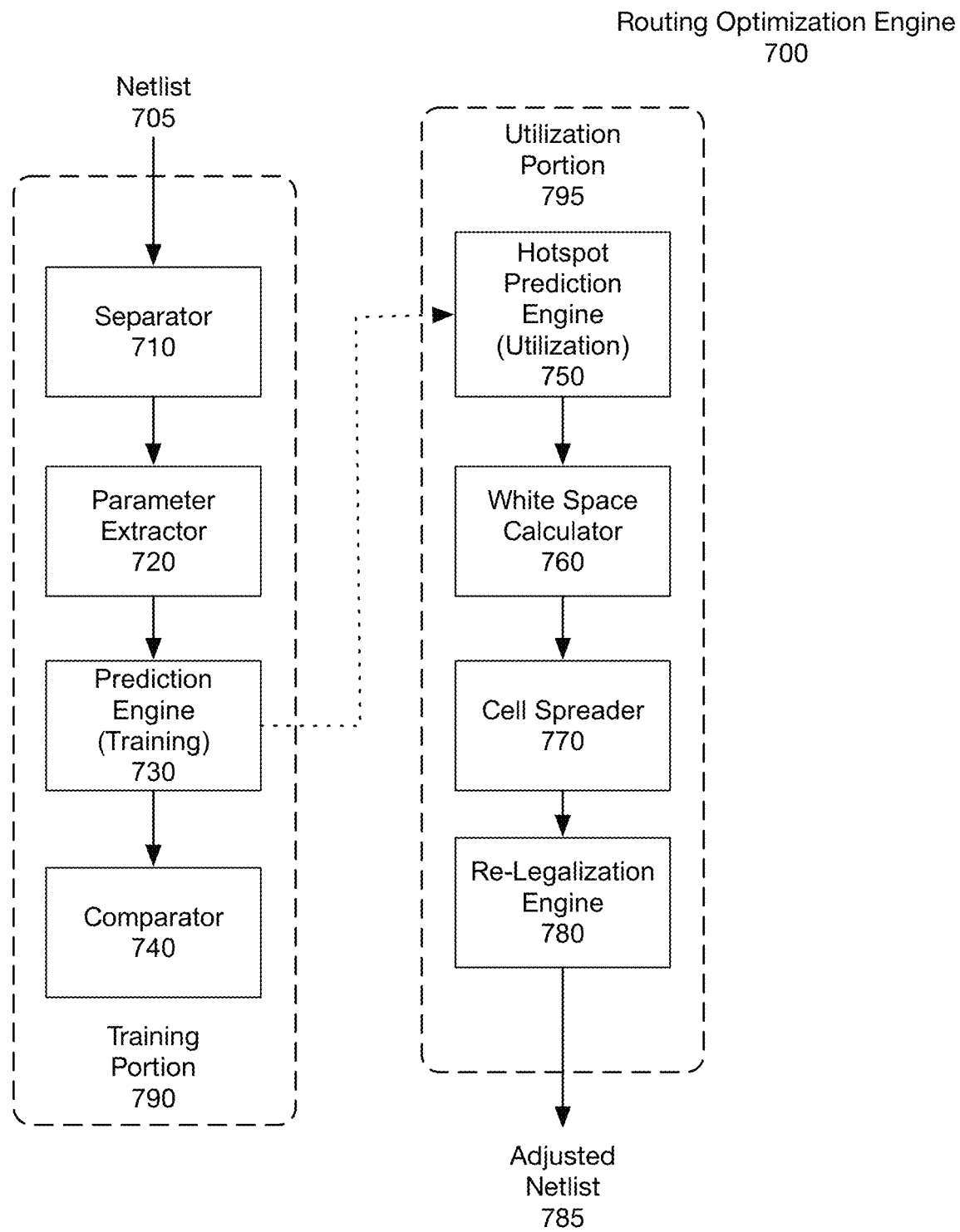
FIG. 7 is a block diagram of one embodiment of the routing optimization engine.

FIG. 7 is a block diagram of one embodiment of the routing optimization engine 700. The engine includes training portion 790 and utilization portion 795. The training portion 790 includes a separator 710, parameter extractor 720, prediction engine (training 730), and comparator 740. The separator 710 separates the training data set into "training" and "verification" data sets. The netlists 705 are run through the training portion, with a first portion of each netlist used for training, and a second portion used for verifying the training. The prediction engine 730 once trained becomes the hotspot prediction engine 750.

The hotspot prediction engine 750 predicts the locations of the hotspots in the target design. White space calculator 760 calculates the location of the white spaces around each of the identified hotspots. Cell spreader 770 moves the white spaces and cells at the hotspots, to reduce congestion. Re-legalization engine 780 ensures that the adjusted netlist 785 still passes the required constraints.

Figure 8:
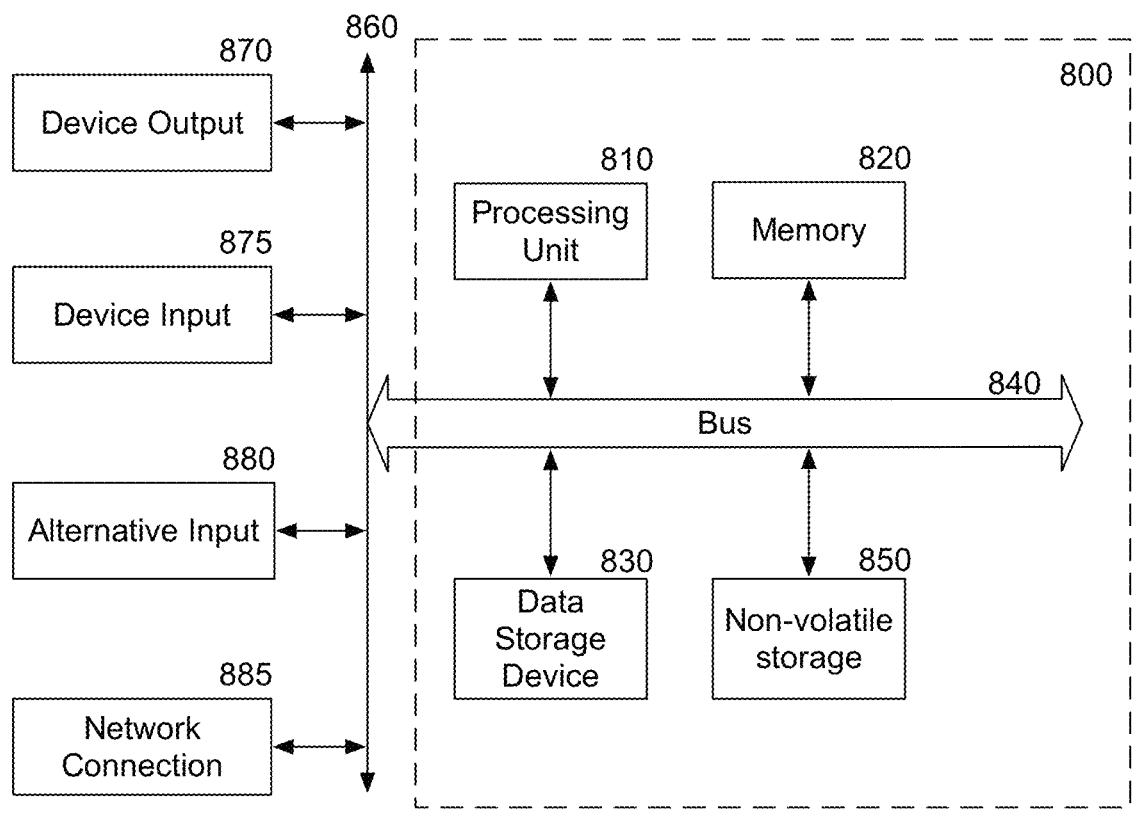
FIG. 8 is a block diagram of one embodiment of a computer system that may be used with the present invention

FIG. 8 is a block diagram of one embodiment of a computer system that may be used with the present invention. It will be apparent to those of ordinary skill in the art, however that other alternative systems of various system architectures may also be used.

The data processing system illustrated in FIG. 8 includes a bus or other internal communication means 840 for communicating information, and a processing unit 810 coupled to the bus 840 for processing information. The processing unit 810 may be a central processing unit (CPU), a digital signal processor (DSP), or another type of processing unit 810.

The system further includes, in one embodiment, a random access memory (RAM) or other volatile storage device 820 (referred to as memory), coupled to bus 840 for storing information and instructions to be executed by processor 810. Main memory 820 may also be used for storing temporary variables or other intermediate information during execution of instructions by processing unit 810.

The system also comprises in one embodiment a read only memory (ROM) 850 and/or static storage device 850 coupled to bus 840 for storing static information and instructions for processor 810. In one embodiment, the system also includes a data storage device 830 such as a magnetic disk or optical disk and its corresponding disk drive, or Flash memory or other storage which is capable of storing data when no power is supplied to the system. Data storage device 830 in one embodiment is coupled to bus 840 for storing information and instructions.

The system may further be coupled to an output device 870, such as a cathode ray tube (CRT) or a liquid crystal display (LCD) coupled to bus 840 through bus 860 for outputting information. The output device 870 may be a visual output device, an audio output device, and/or tactile output device (e.g. vibrations, etc.)

An input device 875 may be coupled to the bus 860. The input device 875 may be an alphanumeric input device, such as a keyboard including alphanumeric and other keys, for enabling a user to communicate information and command selections to processing unit 810. An additional user input device 880 may further be included. One such user input device 880 is cursor control device 880, such as a mouse, a trackball, stylus, cursor direction keys, or touch screen, may be coupled to bus 840 through bus 860 for communicating direction information and command selections to processing unit 810, and for controlling movement on display device 870.

Another device, which may optionally be coupled to computer system 800, is a network device 885 for accessing other nodes of a distributed system via a network. The communication device 885 may include any of a number of commercially available networking peripheral devices such as those used for coupling to an Ethernet, token ring, Internet, or wide area network, personal area network, wireless network or other method of accessing other devices. The communication device 885 may further be a null-modem connection, or any other mechanism that provides connectivity between the computer system 800 and the outside world.

Note that any or all of the components of this system illustrated in FIG. 8 and associated hardware may be used in various embodiments of the present invention.

It will be appreciated by those of ordinary skill in the art that the particular machine that embodies the present invention may be configured in various ways according to the particular implementation. The control logic or software implementing the present invention can be stored in main memory 820, mass storage device 830, or other storage medium locally or remotely accessible to processor 810.

It will be apparent to those of ordinary skill in the art that the system, method, and process described herein can be implemented as software stored in main memory 820 or read only memory 850 and executed by processor 810. This control logic or software may also be resident on an article of manufacture comprising a computer readable medium having computer readable program code embodied therein and being readable by the mass storage device 830 and for causing the processor 810 to operate in accordance with the methods and teachings herein.

The present invention may also be embodied in a handheld or portable device containing a subset of the computer hardware components described above. For example, the handheld device may be configured to contain only the bus 840, the processor 810, and memory 850 and/or 820.

The handheld device may be configured to include a set of buttons or input signaling components with which a user may select from a set of available options. These could be considered input device #1 875 or input device #2 880. The handheld device may also be configured to include an output device 870 such as a liquid crystal display (LCD) or display element matrix for displaying information to a user of the handheld device. Conventional methods may be used to implement such a handheld device. The implementation of the present invention for such a device would be apparent to one of ordinary skill in the art given the disclosure of the present invention as provided herein.

The present invention may also be embodied in a special purpose appliance including a subset of the computer hardware components described above, such as a kiosk or a vehicle. For example, the appliance may include a processing unit 810, a data storage device 830, a bus 840, and memory 820, and no input/output mechanisms, or only rudimentary communications mechanisms, such as a small touch-screen that permits the user to communicate in a basic manner with the device. In general, the more special-purpose the device is, the fewer of the elements need be present for the device to function. In some devices, communications with the user may be through a touch-based screen, or similar mechanism. In one embodiment, the device may not provide any direct input/output signals, but may be configured and accessed through a website or other network-based connection through network device 885.

It will be appreciated by those of ordinary skill in the art that any configuration of the particular machine implemented as the computer system may be used according to the particular implementation. The control logic or software implementing the present invention can be stored on any machine-readable medium locally or remotely accessible to processor 810. A machine-readable medium includes any mechanism for storing information in a form readable by a machine (e.g. a computer). For example, a machine readable medium includes read-only memory (ROM), random access memory (RAM), magnetic disk storage media, optical storage media, flash memory devices, or other storage media which may be used for temporary or permanent data storage. In one embodiment, the control logic may be implemented as transmittable data, such as electrical, optical, acoustical or other forms of propagated signals (e.g. carrier waves, infrared signals, digital signals, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A computer-implemented routability optimization engine comprising:
    a hotspot prediction engine to predict locations of a plurality of routability hotspots in a circuit layout based on a machine learning system, the hotspot prediction engine utilizing a plurality of windows defining a subset of the circuit layout for evaluation, wherein each of the plurality of windows has a center global routing cell (gcell), the hotspot prediction engine further to assign one or more of average and extremal values of selected parameters to the center cell;

wherein the machine learning system utilizes a plurality of parameters selected from among: local pin density, local cell density, local overflow, demand and capacity of each metal layer, demand and capacity of each via layer, average and minimum spacing between pins, fan-in and fan-out, frequency of cell types, number of connected pins, connectivity parameters, and structural parameters;

a white space calculator to calculate white space around each of the plurality of hotspots; and cell spreader engine to redistribute white space around each of the plurality of hotspots to improve routability of the circuit layout marking out local windows around the hotspot, calculating an amount of white space budget available in the local windows, and incrementally distributing the white space budget among the cell instances within the local windows.

2. The routability optimization engine of claim 1, wherein the hotspot prediction engine utilizes a support vector model (SVM) with a radial basis function (RBF) kernel.

3. The routability optimization engine of claim 1, further comprising:

the cell spreader engine further to translate the white space budget for each cell instance into a temporary "keepout" blockage adjacent to the cell instance, legalize a modified layout, and remove the temporary blockages.

4. A method comprising:

predicting locations of a plurality of routability hotspots in a circuit layout based on a machine learning operation;

calculating white space around each of the plurality of hotspots;

redistributing, by a processor, the white space around each of the plurality of hotspots to improve routability of the circuit layout, the redistributing comprising:
 identifying local windows around a hotspot of the plurality of hotspots;
 calculating an amount of white space budget available in the local windows; and
 incrementally distributing, by the processor, the white space budget among cell instances within the local windows.

5. The method of claim 4, wherein the hotspot prediction utilizes a support vector model (SVM).

6. The method of claim 5, wherein the SVM utilizes a radial basis function (RBF) kernel.

7. The method of claim 4, further comprising:
 wherein the local windows define a subset of the circuit layout for evaluation.

8. The method of claim 4, wherein the local windows have a plurality of sizes.

9. The method of claim 8, wherein each of the local windows has a center global routing cell (gcell), the method further comprising:
 assigning one or more of average and extremal values of selected parameters to the center global routing cell.

10. The method of claim 4, further comprising:
 verifying a legality of the adjusted circuit layout.

11. The method of claim 10, iterating through the method a plurality of times.

12. The method of claim 4, wherein the machine learning operation is based on a plurality of parameters.

13. The method of claim 12, wherein the parameters comprise a plurality of: local pin density, local cell density, local overflow, demand and capacity of each metal layer, demand and capacity of each via layer, average and minimum spacing between pins, fan-in and fan-out, frequency of cell types, number of connected pins, connectivity parameters, and structural parameters.

14. The method of claim 4, further comprising:
 translating the white space budget for each cell instance into a temporary "keepout" blockage adjacent to the cell instance, legalize a modified layout, and remove the temporary blockages.

15. A computer-implemented method to improve placement for fewer detailed route design rule check (DRC) violations comprising:
 analyzing global and detailed routing results using machine learning methods;
 identifying a routability hotspot;
 marking out local windows around the hotspot;
 calculating an amount of white space budget available in the local windows; and
 incrementally distributing the white space budget among cell instances within the local windows.

16. The method of claim 15, wherein the machine learning methods are executed by: statically offline or incrementally when the method is used.

17. The method of claim 15, wherein the placement improvement is to one or more of: coarse/global placement or detailed/legalized placement.

18. The method of claim 15, wherein the analyzing utilizes one or more of: global routing parameters, detailed routing parameters, netlist structure parameters, lib cell layout parameters, and design layout parameters.

19. The method of claim 15, wherein the analysis is applied to data measured simultaneously at multiple levels of spatial granularity.

\* \* \* \* \*